US009282662B2

(12) United States Patent
Tsai et al.

(10) Patent No.: US 9,282,662 B2
(45) Date of Patent: Mar. 8, 2016

(54) ELECTRONIC DEVICE INCLUDING RETRACTABLE BOLT MEMBER (71) Applicant: Hewlett-Packard Development Company, L.P., Houston, TX (US)

(72) Inventors: Chia-Ming Tsai, Taipei (TW); Jeffrey A. Lev, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 14/421,137

(22) PCT Filed: Sep. 28, 2012

(86) PCT No.: PCT/US2012/057871
§ 371 (c)(1),
(2) Date: Feb. 11, 2015

(87) PCT Pub. No.: WO2014/051616
PCT Pub. Date: Apr. 3, 2014

(65) Prior Publication Data
US 2015/0195937 A1    Jul. 9, 2015

(51) Int. Cl.
*H05K 5/03* (2006.01)
*G06F 1/18* (2006.01)
(Continued)

(52) U.S. Cl.
CPC ............... *H05K 5/03* (2013.01); *G06F 1/1656* (2013.01); *G06F 1/18* (2013.01); *H04B 1/3888* (2013.01);
(Continued)

(58) Field of Classification Search
CPC . G06F 1/1656; H04B 1/3888; H04M 1/0249; H05K 5/0013; H05K 5/03; E05B 47/0038

USPC ........................................................ 455/575.8
See application file for complete search history.

(56) References Cited

U.S. PATENT DOCUMENTS 4,848,812 A * 7/1989 Slaughter .............. E05C 19/163
                                                          292/144
6,891,722 B2    5/2005 Chen et al.
(Continued)

FOREIGN PATENT DOCUMENTS

CN          101868130 A    10/2010
KR    10-2007-0006290 A     1/2007
(Continued)

OTHER PUBLICATIONS

International Search Report and Written Opinion received in related PCT Application No. PCT/US2012/057871, mailed Apr. 30, 2013, 10 pg.
(Continued)

*Primary Examiner* — Barry Taylor
(74) *Attorney, Agent, or Firm* — Hewlett-Packard Patent Dept.

(57) ABSTRACT

In one implementation, an electronic device comprises a first housing portion including a wall and a detent member on the interior of the wall and a second housing portion to attach to the first housing portion to form an enclosure. A retractable bolt member mounted in the second housing portion can engage the detent member in a first position and can disengage the detent member in a second position. The bolt member can be resiliently biased to the first position and at least part of the bolt member has magnetic properties that force the bolt member to be repelled to the second position if a magnetic field is applied outside the wall adjacent the detent to interact with the bolt member, so that the first housing portion can be detached from the second housing portion.

15 Claims, 11 Drawing Sheets

(51) Int. Cl.
  *H04B 1/3888* (2015.01)
  *H04M 1/11* (2006.01)
  *H05K 5/00* (2006.01)
  *G06F 1/16* (2006.01)
  *H04M 1/02* (2006.01)

(52) U.S. Cl.
  CPC .............. *H04M 1/0249* (2013.01); *H04M 1/11* (2013.01); *H05K 5/0013* (2013.01); *H05K 5/0017* (2013.01); *H05K 5/0086* (2013.01); *Y10T 29/49815* (2015.01)

(56) References Cited

U.S. PATENT DOCUMENTS

| | | | |
|---|---|---|---|
| 6,922,333 | B2 | 7/2005 | Weng et al. |
| 7,054,152 | B2 | 5/2006 | Francke et al. |
| 2008/0168811 | A1 | 7/2008 | Nagelski |
| 2009/0174990 | A1* | 7/2009 | Ligtenberg ............ H01R 13/74 361/679.01 |
| 2010/0172108 | A1 | 7/2010 | Yang |
| 2011/0216485 | A1* | 9/2011 | Kang .................. H04M 1/0254 361/679.01 |
| 2011/0234062 | A1* | 9/2011 | Hsieh .................... E05B 47/004 312/223.1 |
| 2012/0120566 | A1 | 5/2012 | Miao et al. |

FOREIGN PATENT DOCUMENTS

| | | |
|---|---|---|
| KR | 10-1020631 A | 3/2011 |
| TW | 201029426 A | 8/2010 |

OTHER PUBLICATIONS

Krettek, C. et al.; Jul. 1999; "A Mechanical Distal Aiming Device for Distal Locking in Femoral Nails"; On pp. 267-275; vol. 365.

* cited by examiner

ELECTRONIC DEVICE INCLUDING RETRACTABLE BOLT MEMBER

BACKGROUND

Computing and other electronic devices include many complex components. Components may fail over time and require replacement. When such devices are repaired or serviced the components in the system are accessed. An enclosure or housing may have portions that are glued or snap-hooked together. Opening an enclosure that was glued or snapped together can cause damage that has to be repaired to reassemble the case. In servicing the electronic devices, one part of the housing such as the display may have to be pulled from another part of the housing, therefore risking damage to their attachment hooks or the glue.

DETAILED DESCRIPTION

In one implementation, an electronic device is provided comprising: a first housing portion including a wall and a detent member on the interior of the wall; a second housing portion to attach to the first housing portion to form an enclosure; a retractable bolt member mounted in the second housing portion to engage the detent member in a first position and to disengage the detent member in a second position, wherein the bolt member is resiliently biased to the first position and at least part of the bolt member has magnetic properties that force the bolt member to be repelled to the second position if a magnetic field is applied outside the wall adjacent the detent to interact with the bolt member, so that the first housing portion can be detached from the second housing portion.

In another implementation, a system is provided comprising: a frame to receive the electronic device, a frame magnet attached to the frame to align with the bolt member of the electronic device when the electronic device is received in the frame.

In another implementation, a method is provided comprising: applying an external magnetic field, by a frame to a magnetic element associated with an electronic device, to repel a bolt member from the external magnetic field to cause the bolt member move from a first position to a second position; and disengaging the bolt member in a second housing portion from a detent in a first housing portion.

Figure 1:
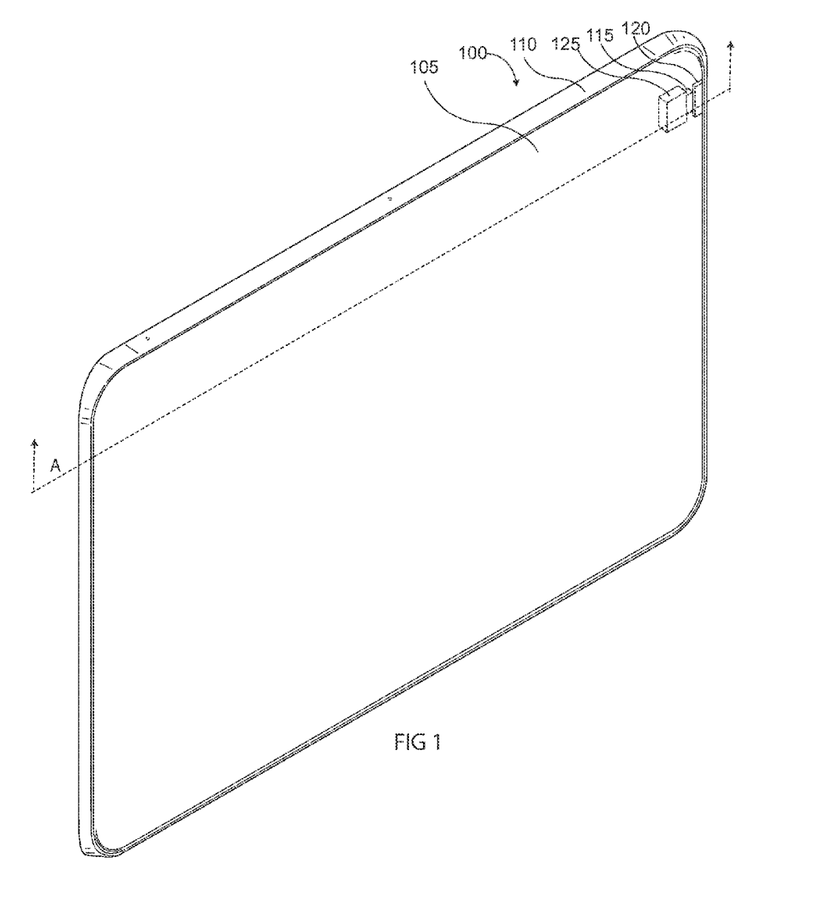
FIG. 1 is a perspective view of an electronic device including a magnetic bolt and detent latch arrangement according to an example implementation.

With reference to the figures, FIG. 1 is a perspective view of an electronic device including a retractable magnetic bolt and detent latch arrangement according to an example implementation.

In this implementation, an electronic device 100 includes a first housing portion 110 including a detent 120 and second housing portion including a retractable boll member 115. The first housing portion 110 and the second housing portion 120 engage to form a substantially flat, thin rectangular enclosure such as may be used for a tablet computer, smartphone or flat panel display monitor or all-in-one personal computer, for instance. The detent 120, boll member 115 and bolt housing 125 are shown as dotted lines in FIG. 1 as they are internal to the electronic device in this example. The bolt member 115 can be a metallic prism, such as a pin or bar. The bolt member 115 is mounted in the second housing portion, and engages the detent 120 in a first position and is disengaged from the detent 120 in a second position. The detent may be any suitable element such as a boss, shelf or other protuberance or depression in or on an inner wall of the electronic device that resists relative lateral movement of the bolt member to prevent the housing portions from being separated. The detent 120 is shown for the purposes of illustration in FIG. 1 as a shelf extending from the side of the first housing, but may be different shapes. A bolt housing 125 is provided on the second housing portion and can include a resilient bias mechanism, such as a spring which may be a part of a spring assembly, to bias the bolt member 115 to the first position.

The bolt member 115 has magnetic properties to force the bolt member 115 to retract to the second position if a magnetic field is placed outside the second housing. Cross sections of the electronic device across "A" are shown in FIGS. 3A, 3B, 3C, 4A, 4B and 4C.

The magnetic properties of the bolt member 115 may be provided by the bolt member being a bipolar permanent magnet, such as a ferromagnet, or an electromagnet, having poles at both ends. Alternatively, the bolt member may be fabricated from diamagnetic material that is repelled by a magnetic field. In other embodiments, only a portion or component of the bolt member may have such magnetic properties.

Figure 2:
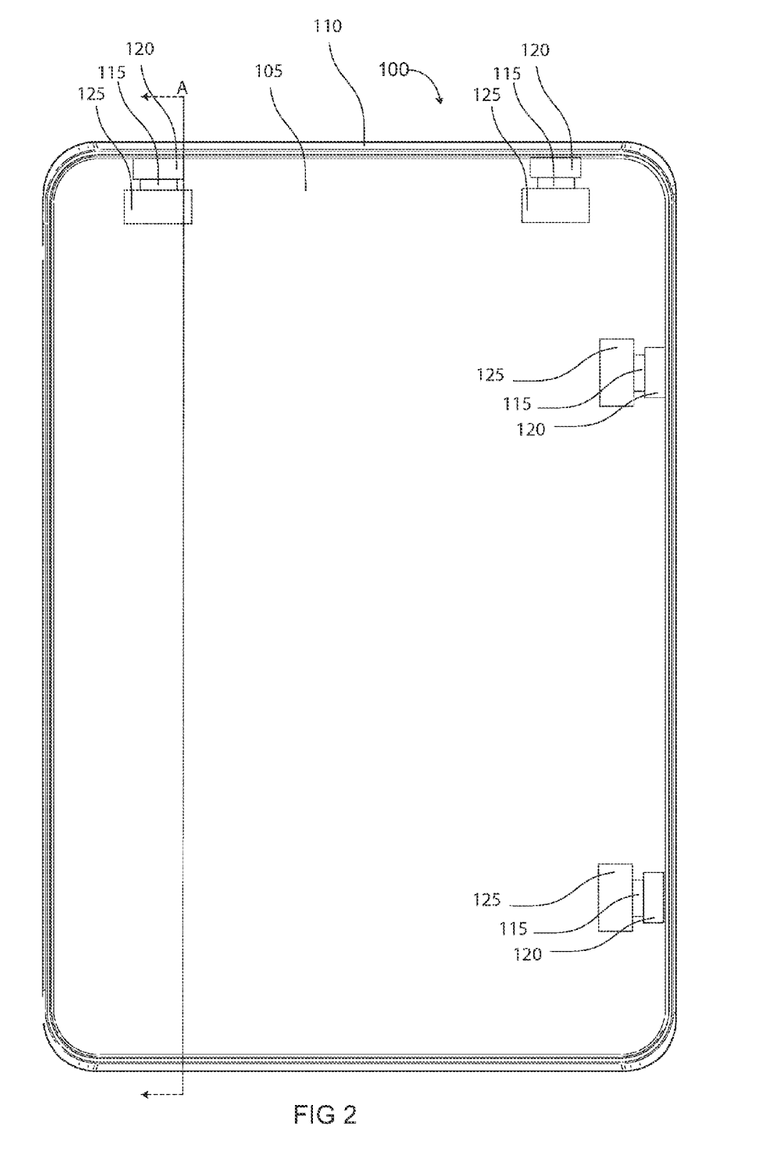
FIG. 2 is a front view of an electronic device including a magnetic bolt and detent latch arrangement according to an example implementation.

FIG. 2 is a front view of an electronic device including a plurality of magnetic boll and detent latch mechanisms according to an example implementation. The electronic device may be a tablet computer, smartphone or display monitor for instance. The electronic device may include a plurality of retractable bolt members 115 and bolt housings 125 that engage a respective plurality of detents 120. The bolt members 115 and detents 120 may be along one side, may be on adjacent sides as shown, may be on opposite sides or may be on all sides.

The electronic device may be substantially flat and the first housing portion comprises a plurality of detent members 120 arranged around an edge of the first housing portion 110. The second housing portion 105 comprises a plurality of bolt members 115 each mounted in the second housing portion to engage respective ones of the detent members in a first position and to disengage the respective ones of the detent member in a second position.

Figure 3A:
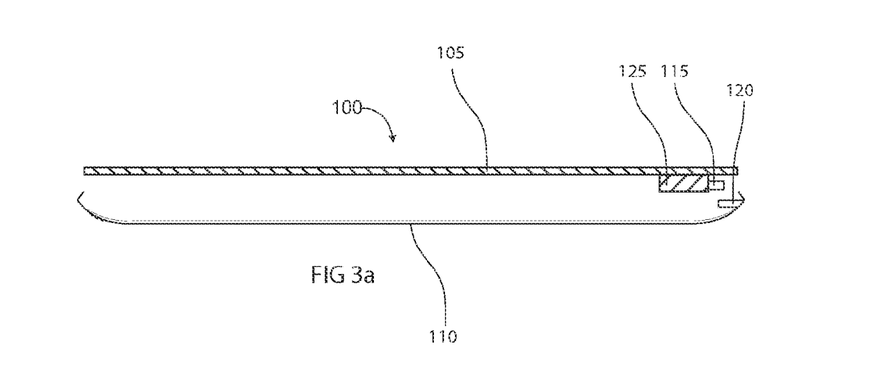
FIGS. 3a, 3b, and 3c are a cross section of an electronic device including a magnetic bolt and detent latch arrangement according to example implementations.
Figure 3B:
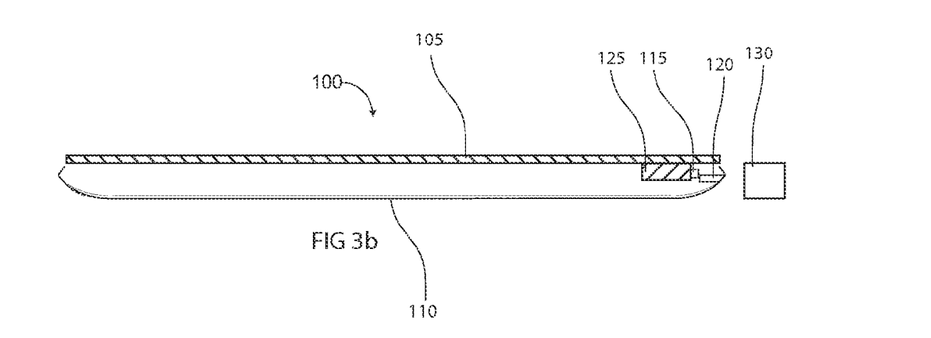
Figure 3C:
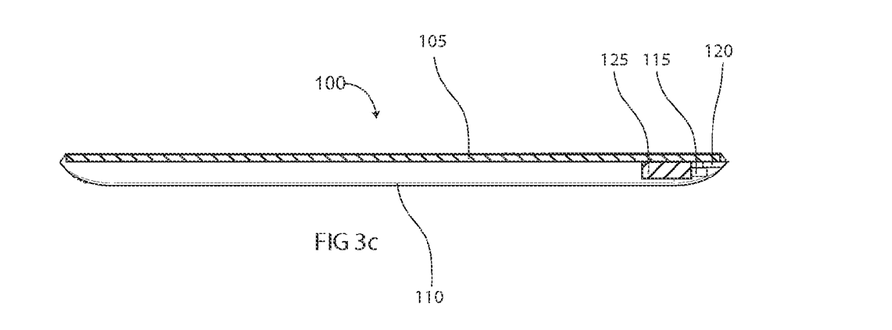

FIGS. 3a, 3b, and 3c are a cross section of an electronic device including a magnetic bolt and detent latch mechanism according to example implementations. The cross sections are views according to "A" in FIGS. 1 and 2 in various levels of engagement between the first housing portion 110 and the second housing portion 105.

FIG. 3a is a cross section of an electronic device 100 including a bolt member 115 according to an example implementation. The first housing portion 110 and the second housing portion 105 are shown separated with the bolt member 115 disengaged from the detent 120. The detent 120 is shown as a shelf extending from a wall of the first housing portion 110 but may be different shapes. For instance, the detent 120 may be a hole or depression in the wall of the first housing portion 110 or may be another type of detent. A bolt housing 125 includes a spring mechanism for biasing the bolt member 115 to the first position. The bolt member 115 can retract into a cavity of the bolt housing 125. The bolt member 115 can retract longitudinally in a direction substantially perpendicular to the wall of the first housing portion on which the detent 120 is provided. The bolt member 115 may be described as spring loaded due to the bias in the bolt housing 125.

FIG. 3b is a cross section of an electronic device 100 including a bolt member 115 according to an example implementation. The first housing portion 110 is shown partially, but not fully, attached to the second housing portion 105. A magnetic field is created by an external magnet 130 to cause the bolt member 115 to overcome the force of the bias from the bolt housing 125 on the bolt member 115 causing the bolt member 115 to move to the second position.

The bolt member 115 may be for example, a permanent magnet with its south pole oriented toward the detent 120. External magnet 130 may also have a south pole oriented toward the bolt member 115 to cause the bolt member 115 to move from the first position to a second position. Of course, the magnets may equally be arranged so that their north poles are facing each other or any other materials and arrangements may be used that cause bolt member 115 to be repelled by an externally applied magnetic field and thereby to be retracted.

The external magnet 130 may be part of a frame to attach to the exterior of the electronic device and to provide a localized magnetic field to the exterior of the electronic device 100 to force the bolt member to the second position.

FIG. 3c is a cross section of an electronic device 100 including a bolt member 115 according to an example implementation. The first housing portion 110 and the second housing portion 105 are shown attached by the bolt member 115 engaging the detent 120. The bolt member 115 returns to the first position when the external magnet 130 shown in FIG. 3b is removed from the exterior of the electronic device 100 to engage with the detent 120. The engagement of the detent 120 with the bolt member 115 attaches the first housing portion 110 to the second housing portion 105.

Figure 4A:
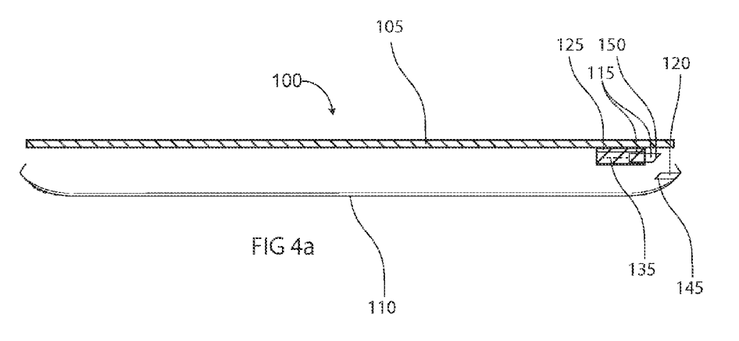
FIGS. 4a, 4b and 4c are a cross section of an electronic device including a magnetic bolt and detent latch arrangement according to example implementations.
Figure 4B:
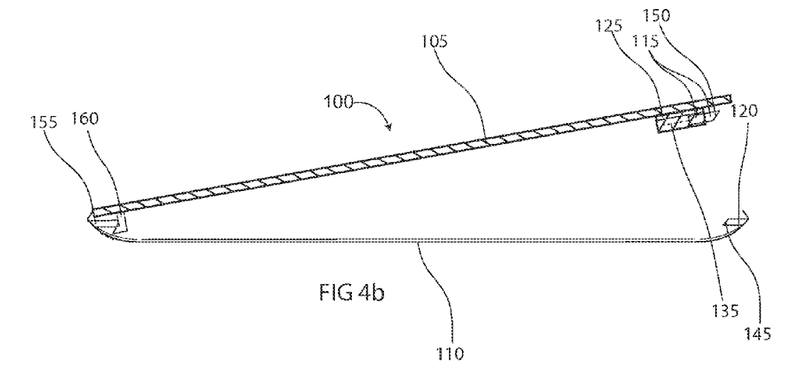
Figure 4C:
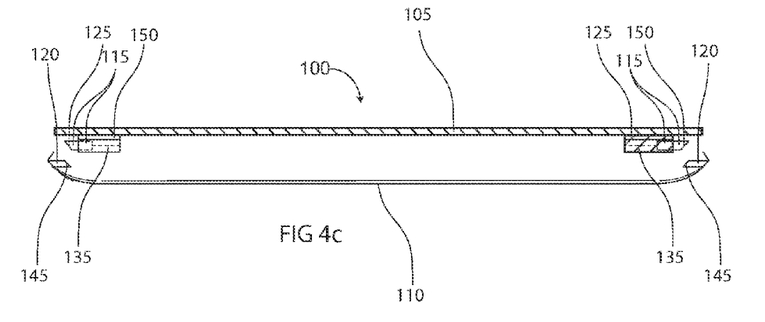

FIGS. 4a, 4b and 4c are a cross section of an electronic device including a magnetic bolt and detent latch mechanism according to example implementations.

In one implementation, either one of the first housing portion and the second housing portion may be a display element. For example, if the electronic device is a tablet computing device or a portable phone such as a smartphone the display element may include glass that is part of the outer housing portion. In the case of a tablet computing device for example, the first housing portion 110 may be made of metal, plastic or another material and including the components such as the battery, processor, memory, wireless modules and other components. The second housing portion 105 may be a display that attaches to the first housing portion 110 and is removed to access the components that are enclosed between the first housing portion 110 and the second housing portion 105. The housing portions may also be parts of a digital music player, notebook computer or another electronic device.

The bolt housing 125 may include a spring 135 to resiliently bias the bolt member 115 toward the detent 120. The spring may be a coil spring or maybe another type of spring. The bias may also be provided by an elastic material such as a rubber material that stretches and returns the bolt member to the first position. Many arrangements are possible.

The detent 120 may include a ramp 145 to force the boll member to the second position during assembly of the first housing portion to the second housing portion. For example, if the detent has a ramp 145 the ramp 145 may cause the bolt member 115 to move to the second position during assembly of the first housing portion 110 to the second housing portion 105, allowing ready assembly of the first housing portion 110 to the second housing portion 105 without using a magnetic field such as 130 in FIG. 1c to move the bolt member 115 to the second position.

The bolt member 115 may include a ramp 150 to force the bolt member 115 to the second position during assembly of the first housing portion 110 to the second housing portion 105. For example if the bolt member 115 has a ramp 150, the ramp 150 may cause the bolt member 115 to move to the second position during assembly of the first housing portion 110 to the second housing portion 105, allowing assembly of the first housing portion 110 to the second housing portion 105 without using a magnet such as 130 in FIG. 1c to move the bolt member to the second position.

FIG. 4b illustrates an implementation that includes a second detent 155 and a third detent 160. To reduce the number of bolt members, the second detent 155 and the third detent 160 can be on opposite side of the device from the bolt members 115. If attaching the second housing portion 105 to the first housing portion 110, the second detent 155 and the third detent 160 can be engaged first as shown in FIG. 2b and then the bolt member can be engaged with the detent 120.

In some embodiments the bolt members may be on all sides of the electronic device or may be on less than all sides. For example, the bolt members may be on 2 adjacent sides and may have second and third detents 155 and 160 on opposing adjacent sides.

FIG. 4c shows an implementation including the bolt member 115, detent 120 or bolt housing 125 on more than one side of the electronic device.

Figure 5:
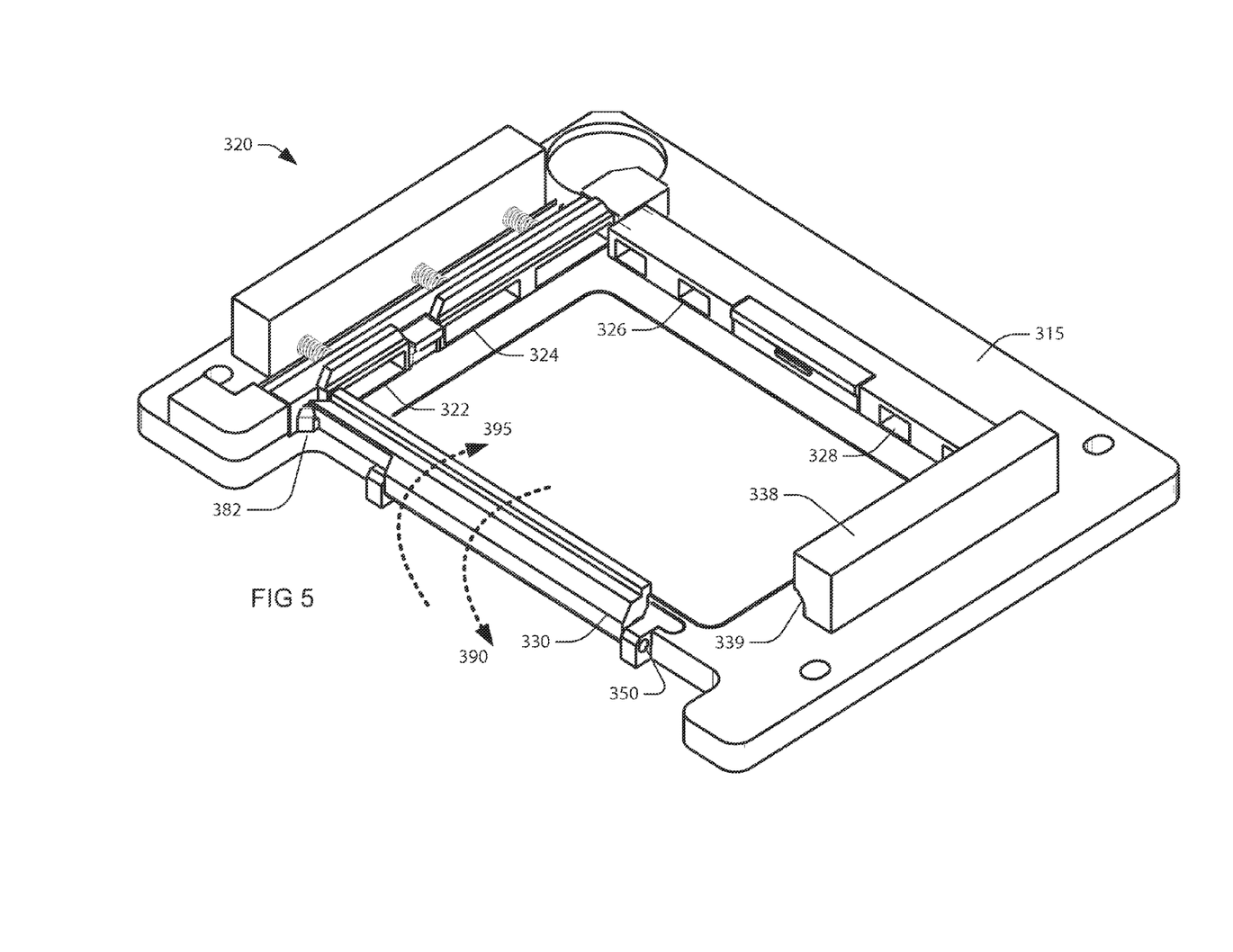
FIG. 5 is a frame according to an example implementation.

FIG. 5 shows a frame according to an example implementation. The frame 320 is to receive an electronic device, such as those illustrated in FIGS. 1 to 4. The electronic device includes a bolt member that is disengaged by a magnetic field to repel a magnetic element in the electronic device to overcome a bias. A magnetic field can be attached to the frame for example a magnet of the same pole as the electronic device magnet can be attached to the frame to align with the magnetic element of the electronic device. The frame 320 includes troughs 322, 324, 326, 328, which can house the external magnets (not shown) placed therein. The frame 320 can be in form of a frame structure that includes an open top, to enable access to the electronic device for its repair. In one implementation, the frame 320 can receive the electronic device, and guide its positioning, such that the internal magnets associated with the electronic device align with the external magnets that are placed in troughs 322, 324, 326, 328 of the frame 320. Such alignment can facilitate interactions of the magnetic fields between the external magnets and the internal magnets, to induce forces and movements required for moving the bolt members from the first position where the bolt member is engaged with the detent to a second position disengaged with the detent of the electronic device.

In a related implementation, the frame 320 can further include a rotary arm 330 that rotates around a hinge 350. When the rotary arm rotates in the direction 390, an open position is created, wherein the frame 320 can receive the electronic device for repair. For example, the electronic device can be guided into the frame 320 by guidance provided through a protrusion 339 and a groove feature 338 which can function as a railing mechanism for moving the electronic device within the frame 320. Therefore, the electronic device can be held securely in position relative to a base plate 315.

Upon receiving the electronic device, the rotary arm 330 can be unlocked from a latch 382 in the open position, to rotate back in the direction 395 to lock in place the electronic device within the frame 320 in a closed position. Therefore, this provides a mechanism reducing the possibility the electronic device is inadvertently released from the frame 320.

Figure 6:
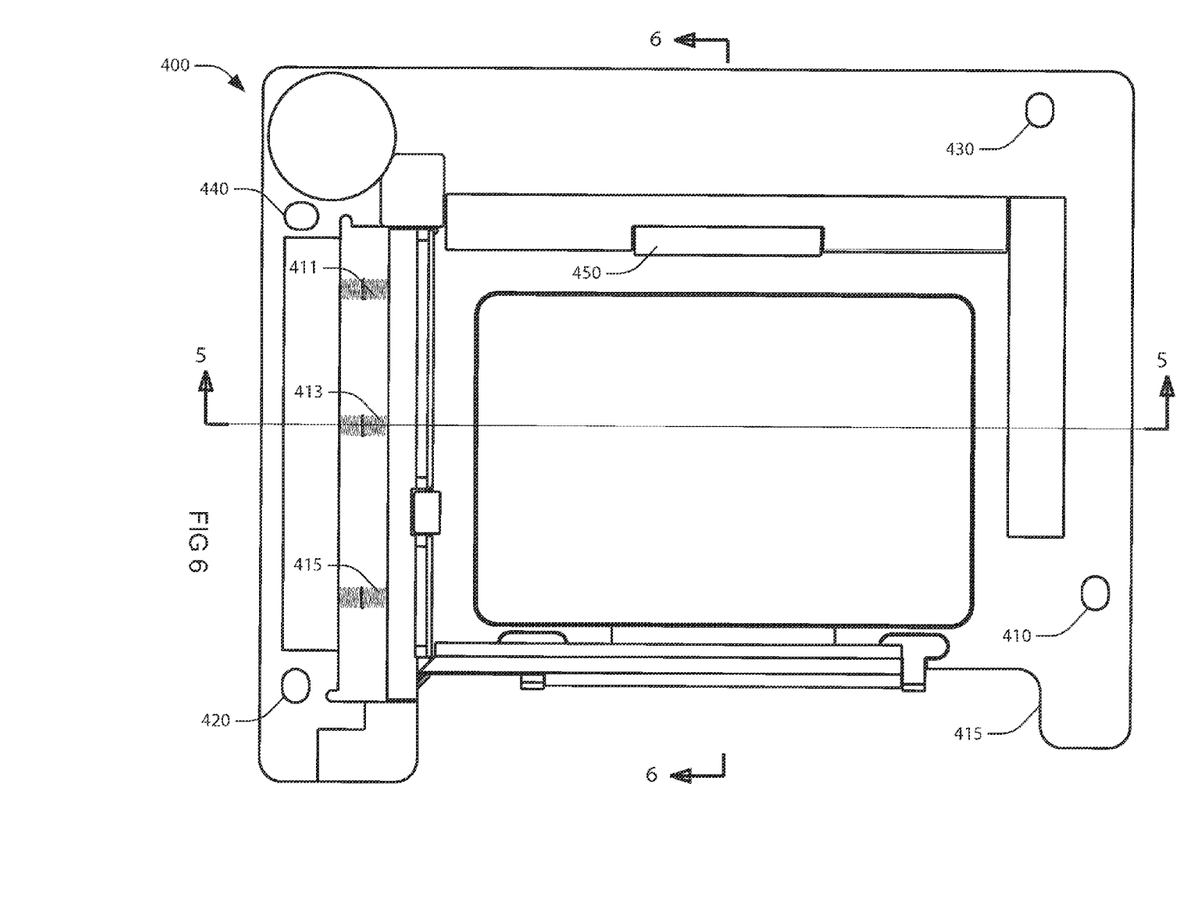
FIG. 6 is a frame according to an example implementation.

FIG. 6 shows a frame according to an example implementation. The frame 400 can include openings 410, 420, 430, 440 for connecting the base plate 415 to a work station (not shown) by employing bolts, screws, fasteners and the like. Moreover, a trough feature as pad of segment 450 can be employed to align it with the docking connector associated with the electronic device, so as to facilitate centering the electronic device within the frame 400. The docking connector may electrically couple to the electronic device in the frame to transfer power and/or data to the electronic device.

By aligning the electronic device with the frame 400, magnets associated with the electronic device are placed under simultaneous influence of the external magnetic fields, to disengage the bolt member from the detent, allowing the housings to be separated. The arrangement of the external magnets positioned on the frame 400 can depend upon the location of magnets already positioned on the electronic device itself.

In a related example, positions of the external magnets can be dynamically adjusted and vary based on type of electronic device, wherein a railing mechanism can facilitate motion and positioning of such external magnets alongside of various locations on the frame 400. Furthermore, additional springs 411, 413, 415 can facilitate movement for one part of the frame 400, relative to another part to further accommodate electronic devices that have different sizes, for example.

Figure 7:
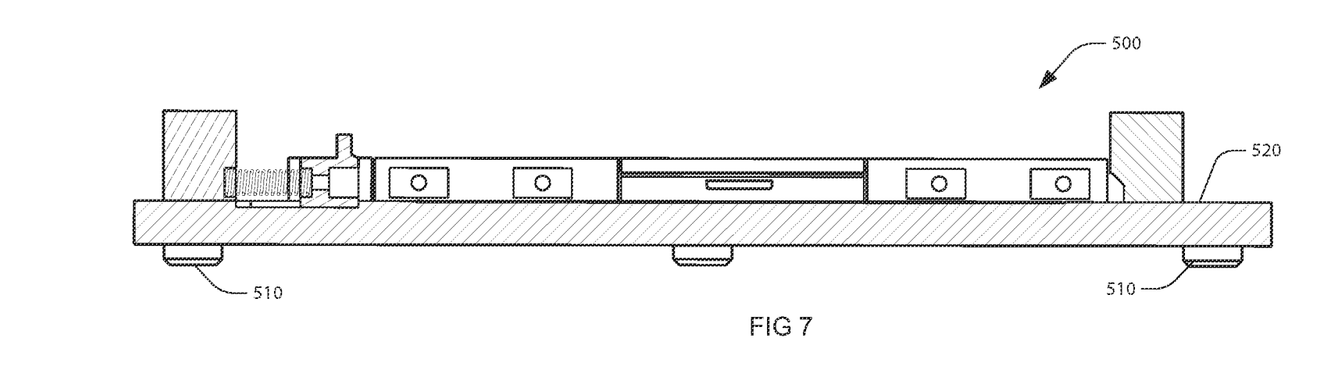
FIG. 7 & FIG. 8 illustrate examples of cross section views of the frame according to an example implementation.

FIG. 7 illustrates an example of cross sectional views for cross section 5-5 of FIG. 6. As illustrated in FIG. 7, the frame 500 can further include rubber footings 510 that can further stabilize positioning or connecting the base plate 520 on a workstation. In this regard, vibrations transferred form the workstation to the baseplate 510 can be reduced. Therefore, overall accuracy of aligning the internal magnetic elements, which are associated with the electronic device with that of the external magnetic elements, which are associated with the frame, is improved.

Figure 8:
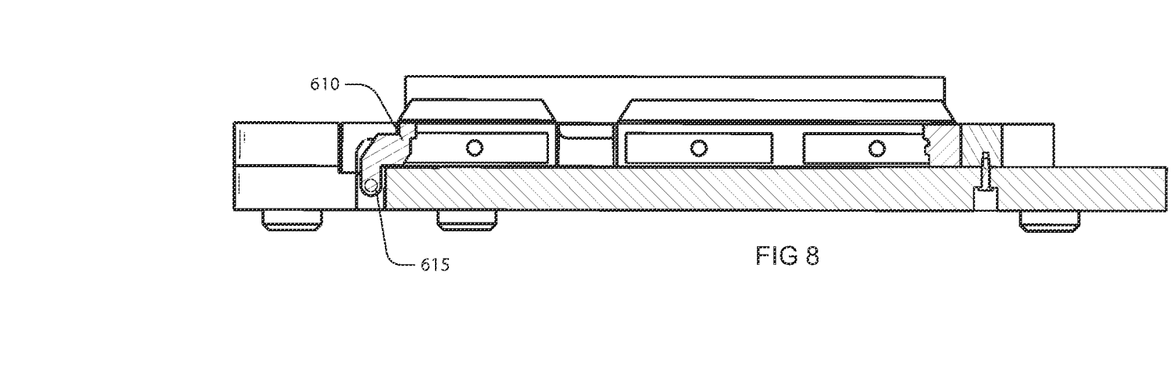

FIG. 8 illustrates an example of cross sectional views for cross section 6-6 of FIG. 6. As illustrated in FIG. 8, the rotary arm 610 can rotate around the hinge 615 between two limiting positions of open and close. In the open position, the frame is ready to receive the electronic device. Likewise, in the closed position, the rotary arm 610 rotates back to the position shown in FIG. 8, and locks in place the electronic device within the frame, to avoid inadvertent removal of the electronic device from the frame during subsequent repair.

Figure 9:
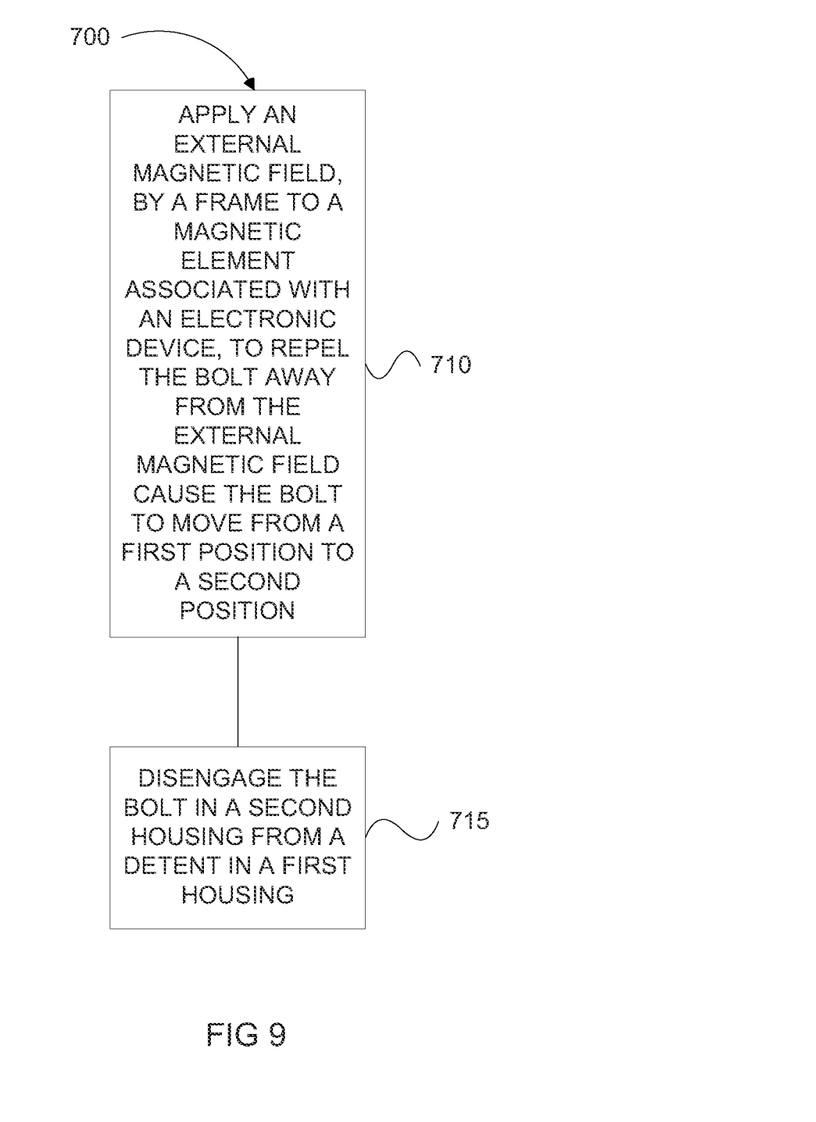
FIG. 9 is a flow diagram of a method to disengage a bolt member according to an example implementation.

FIG. 9 is a flow diagram of a method to disengage a bolt member according to an example implementation. The method 700 includes applying an external magnetic field, by a frame to a magnetic element associated with an electronic device, to repel the bolt member away from the external magnetic field cause the bolt member to move from a first position to a second position at 710. The second position of the bolt member is the position of the bolt member when the bolt member is repelled by a force greater than the force of a bias that biases the bolt member to the first position.

If the bolt member is in the second position it is disengaged from a detent in a first housing portion at 715. The first housing portion can then be separated from the second housing portion.

Figure 10:
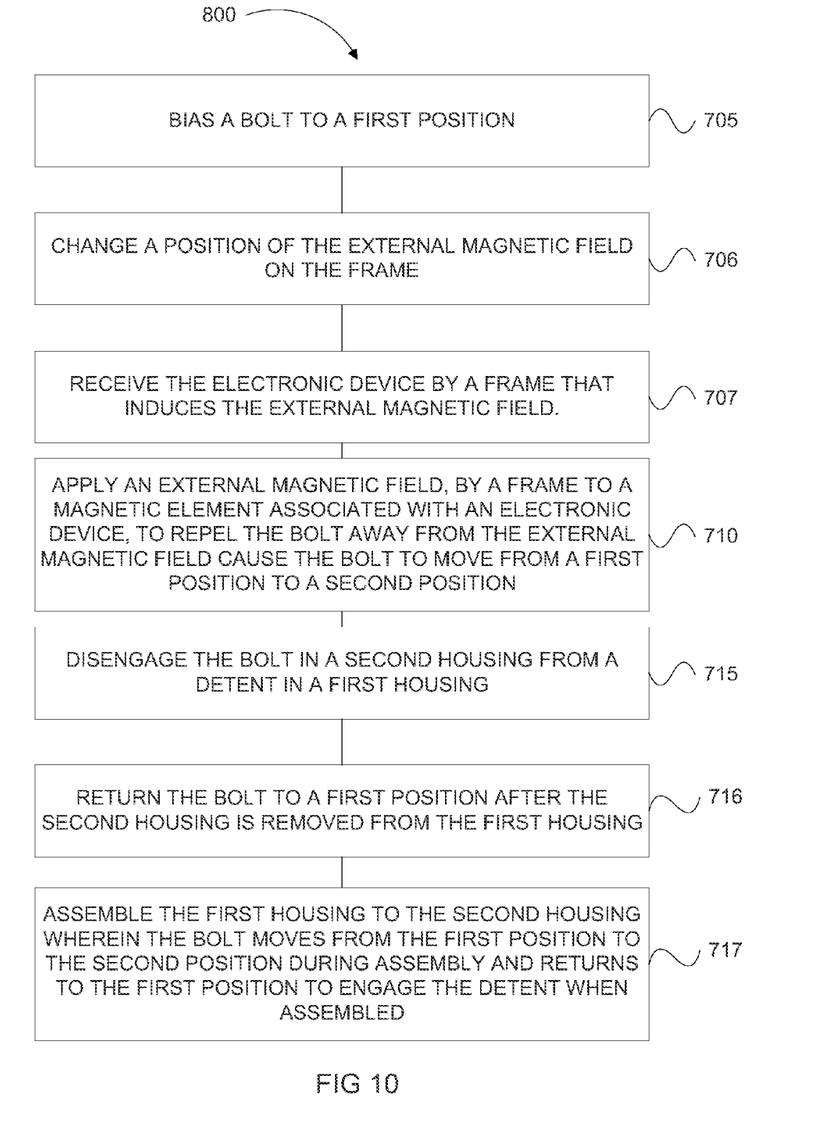
FIG. 10 is a flow diagram of a method to disengage a bolt member according to an example implementation.

FIG. 10 is a flow diagram of a method to disengage a bolt member according to an example implementation. The method 800 includes a bolt member biased to a first position at 705. The bias can be created by a spring, elastic, magnets or another biasing system. The first position of the bolt member is the position when the bolt member is not acted on by an external magnet.

A position of the external magnetic field can be changed on the frame at 706. The position of the external magnetic field can align with the bolt member of the electronic device.

The electronic device can be received by a frame that includes the external magnetic field at 707.

An external magnetic field can be applied, by a frame to a magnetic element associated with an electronic device, to repel a bolt member away from the external magnetic field cause the bolt member to move from a first position to a second position at 710. The second position of the bolt member is the position of the bolt member when the bolt member is repelled by a force greater than the force of a bias that biases the bolt member to the first position.

If the bolt member is in the second position it is disengaged from a detent in a first housing portion at 715. The first housing portion can then be separated from the second housing portion.

The bolt member can be returned to a first position after the second housing portion is removed from the first housing portion at 716. The bolt member may return to the first position due to the bias if the second housing portion is moved away from the magnet in the frame that caused the bolt member to move to the second position.

The first housing portion can be assembled to the second housing portion wherein the bolt member moves from the first position to the second position during assembly and returns to the first position to engage the detent when assembled at 717.

Figure 11:
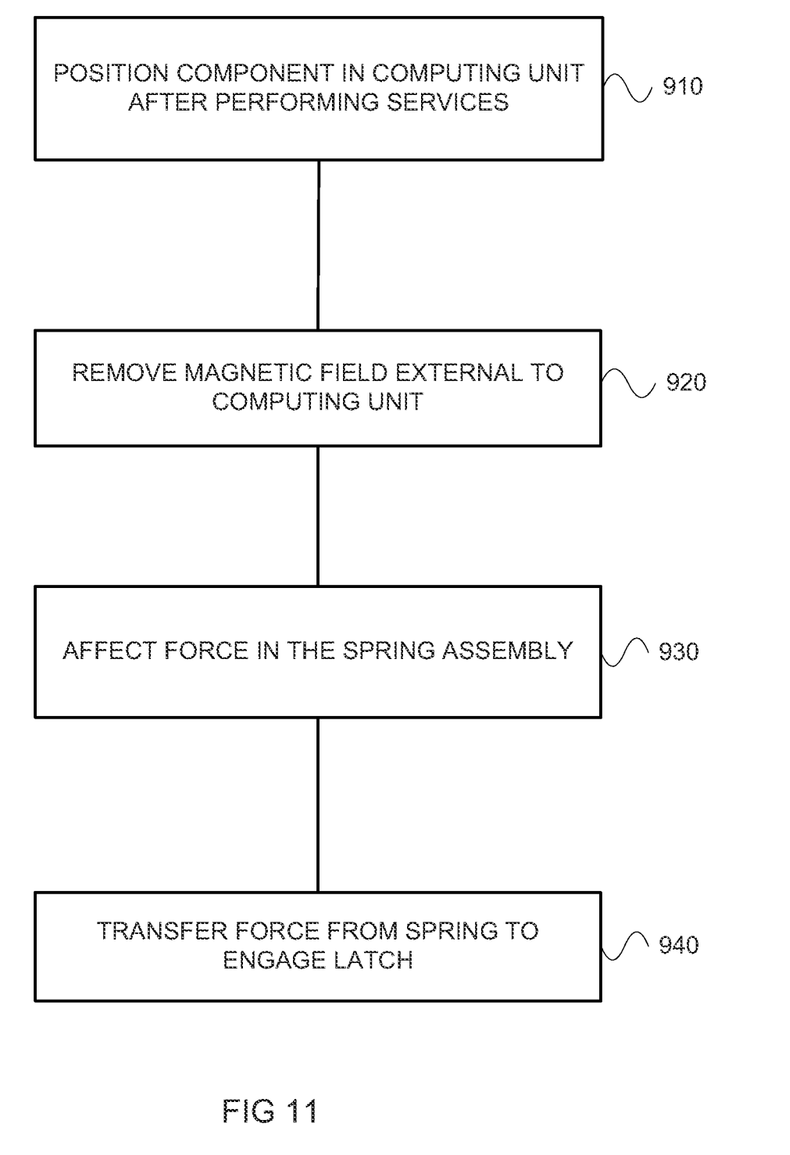
FIG. 11 is a flow diagram of a method to disengage a bolt member according to an example implementation.

FIG. 11 is a flow diagram of a method to disengage a bolt member according to an example implementation. At 910, upon completion of services on a component associated with the electronic device, the component can be replaced back within the electronic device. For example, an electronic device in form of a tablet can comprise a solid back cover and a solid piece of glass display that are mated together. In this regard, a service can include replacing a worn or defected solid piece of glass with a new one. At 920, the magnetic field that is external to the electronic device can be removed. Such removal of the external magnetic field can in turn affect the force in the bias at 930, wherein the bias can revert back to substantially the same position as before the external magnetic field interacted with internal magnets of the electronic device. At 940, the spring assembly can exert a force that is transferred to engage the latch, and maintain the component in a secured position.

Figure 12:
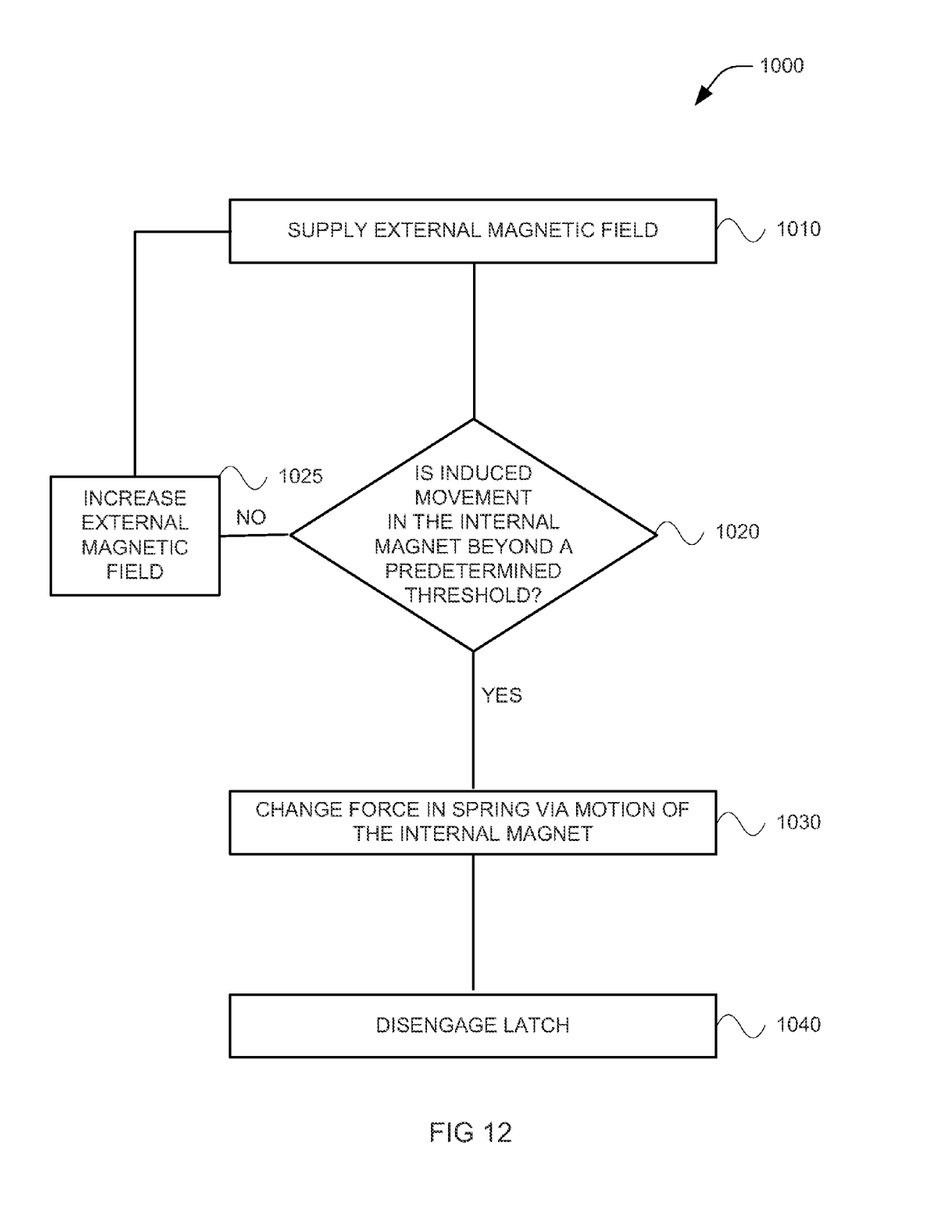
FIG. 12 is a flow diagram of a method to disengage a bolt member according to an example implementation.

FIG. 12 is a flow diagram of a method to disengage a bolt member according to an example implementation. At 1010 an external magnetic field can interact with the internal magnetic element via magnetic fields. For example an external magnetic field can be created when the same poles (e.g. both north poles or both south poles) of the internal and external magnets are in substantial alignment or an internal diamagnetic element and external magnetic field to repel the internal magnet.

At 1020 a determination can be made as to whether such movement of the internal magnet is beyond a predetermined threshold. For example, the predetermined threshold can be considered a few millimeters for removal of a screen from the electronic device. If a determination is made at 1020 that the movement is not beyond a predetermined threshold, the method proceeds to block 1025 wherein the external magnetic field can be increased and the method 1000 reverts back to block 1010. Alternatively, if such movement is beyond a predetermined threshold, the motion of internal magnet can change a force in the spring at 1030. The method 1000 proceeds to block 1040 wherein the latch can be disengaged as a result of the motion for the internal magnet.

While this example is illustrated and described herein as a series of blocks representative of various events and/or acts, the subject innovation is not limited by the illustrated ordering of such blocks. For example, some acts or events may occur in different orders and/or concurrently with other acts or events, apart from the ordering illustrated herein, in accordance with the subject disclosure. In addition, not all illustrated blocks, events or acts, may be required to implement a methodology in accordance with the subject innovation. Moreover, it is noted that the example method and other methods according to the innovation may be implemented in association with the method illustrated and described herein, as well as in association with other systems and apparatus not illustrated or described.

As mentioned, the techniques described herein can be applied to any suitable device. It is to be understood, therefore, that handheld, portable and other computing devices and computing objects of all kinds are contemplated for use in connection with the various embodiments. In addition to the various embodiments described herein, it is to be understood that other similar embodiments can be used or modifications and additions can be made to the described embodiment(s) for performing the same or equivalent function of the corresponding embodiment(s) without deviating therefrom. The subject disclosure is not to be limited to any single embodiment, but rather can be construed in breadth, spirit and scope in accordance with the appended claims.

What is claimed is:

1. A frame for receiving an electronic device to enable detachment of first and second portions of the electronic device, the frame comprising
    a plurality of troughs housing external magnets, the troughs to guide alignment of a received electronic device relative to the frame such that internal magnets included in the electronic device align with the external magnets;
    wherein the guided alignment is to cause an interaction of magnetic fields between the external magnets and the internal magnets to move a bolt member included in a second housing portion of the electronic device from a first position where the bolt member is engaged with a detent member included in a first housing portion of the electronic device to a second position in which the bolt member is disengaged with the detent member.

2. The frame of claim 1, wherein the external magnets are attached to the frame.

3. The frame of claim 1, wherein the external magnets are moveable along the frame.

4. The frame of claim 1, wherein the electronic device is a device with a flat panel display.

5. The frame of claim 1, wherein the first or the second housing portions of the electronic device includes glass.

6. The frame of claim 1, further comprising a rotary arm to rotate around a hinge included in the electronic device in a first direction and an opposite second direction,
    the rotation in the first direction to create an open position as between the frame and the electronic device, the open position for receiving the electronic device, and
    the rotation in the second direction to create a closed position as between the frame and the electronic device, the closed position for securing the electronic device.

7. The frame of claim 1, further comprising a railing mechanism to enable positioning of the external magnets alongside various locations of the frame, the enabled positioning to allowing for dynamic adjustment of position of the external magnets according to a type of the electronic device.

8. A method to disengage a bolt member in an electronic device, comprising:
    receiving an electronic device at a frame including an external magnetic field,
        wherein the electronic device includes a first housing portion with a bolt member biased to a first position that secures the first housing portion to a second housing portion;
    changing position of the external magnetic field to align with the bolt member of the received electronic device, the alignment to cause repelling of the bolt member away from the external magnetic field and cause the bolt member to move from the first position to a second position wherein the bolt is disengaged from the detent in the first housing portion, rendering the first housing portion separable from the second housing portion.

9. The method of claim 8, wherein the repelling force is force greater than force of the bias.

10. The method of claim 8, wherein the external magnetic field is caused by frame magnets moveably attached to the frame.

11. The method of claim 10, wherein the frame magnets are moveable along the frame.

12. A system comprising:
    a frame to receive an electronic device,
        wherein the electronic device is to include
            a first housing portion comprising a wall and a detent member on the interior of the wall;
            a second housing portion removably attached to the first housing portion to form an enclosure;
            a retractable bolt member mounted in the second housing portion to engage the detent member in a first position and to disengage the detent member in a second position, wherein the bolt member is resiliently biased to the first position and at least part of the bolt member has magnetic properties; and
        the frame including a frame magnet to align with the bolt member of the electronic device when the electronic device is received in the frame and to apply a magnetic field outside the wall adjacent the detent to interact with the bolt member, and thereby force the bolt member to be repelled to the second position, so that the first housing portion of the electronic device can be detached from the second housing portion.

13. The system of claim 12 wherein the frame magnet is attached to the frame.

14. The system of claim 12 wherein the frame magnet is moveable along the frame.

15. The system of claim 12, wherein the electronic device is one of a tablet computer and a smartphone.

* * * * *